(12) United States Patent
Onizuka

(10) Patent No.: US 6,409,522 B1
(45) Date of Patent: Jun. 25, 2002

(54) CIRCUIT AND BUSBOARD CONNECTION FOR AN ELECTRICAL CONNECTION BOX

(75) Inventor: Takahiro Onizuka, Nagoya (JP)

(73) Assignees: Autonetworks Technologies, Ltd., Nagoya; Sumitomo Wiring Systems, Ltd., Mie; Sumitomo Electric Industries, Ltd., Osaka, all of (JP)

( * ) Notice: Subject to any disclaimer, the term of this patent is extended or adjusted under 35 U.S.C. 154(b) by 0 days.

(21) Appl. No.: 09/717,064

(22) Filed: Nov. 22, 2000

(30) Foreign Application Priority Data

Nov. 24, 1999 (JP) ............................................ 11-332610

(51) Int. Cl.[7] ............................................... H01R 12/00
(52) U.S. Cl. ......................................... 439/74; 439/949
(58) Field of Search ................................ 439/949, 404, 439/76.2, 74, 75

(56) References Cited

U.S. PATENT DOCUMENTS

| | | | |
|---|---|---|---|
| 4,200,900 A | * | 4/1980 | McGeorge |
| 5,040,993 A | * | 8/1991 | Krug et al. .................... 439/75 |
| 5,091,826 A | * | 2/1992 | Arnett ......................... 434/404 |
| 5,624,274 A | * | 4/1997 | Lin |
| 6,238,221 B1 | * | 5/2001 | Ikeda et al. ................ 439/76.2 |

* cited by examiner

Primary Examiner—Neil Abrams
(74) Attorney, Agent, or Firm—Oliff & Berridge, PLC

(57) ABSTRACT

A circuit connection structure comprises an electronic circuit board 10 having a through-hole 15, the electronic circuit board 10 being provided with lead wires 12 or electric wires of electronic parts 14 in a manner straddling the through-hole 15, and an insulating board 1 provided with bus-bars 2 having upright pressure-contact knife-edges 3 electrically connected to the lead wires 12 or electric wires. The electronic circuit board 10 and the insulating board 1 are stacked up by relatively moving both the boards close to each other in such a condition that the pressure-contact knife-edges are passing through the through-hole, whereby the lead wires 12 or electric wires are pressure-welded to the respective pressure-contact knife-edges 3.

4 Claims, 4 Drawing Sheets

CIRCUIT AND BUSBOARD CONNECTION FOR AN ELECTRICAL CONNECTION BOX

BACKGROUND OF THE INVENTION

1. Field of the Invention

The present invention relates to a circuit forming method and a circuit connection structure in an electrical connection box for use in a vehicle, for example.

2. Description of the Related Art

In an electrical connection box of the sort mentioned above, an electronic circuit board 104 provided with electronic parts 103 between a lower case portion 101 and an upper case portion 102 constituting the electrical connection box, and an insulating board 106 provided with bus-bars 105 are generally housed in a laminated form as shown in FIG. 5.

The electrical connection of the electronic parts 103 to the bus-bars 105 is accomplished by fitting a connector housing 107 retaining female terminals 108 to an edge portion of an electronic circuit board 104 and stacking the electronic circuit board 104 in this state on top of the insulating board 106 thereby to fit bus-bar tabs (male terminals) 105a with the bus-bars 105 in an upright condition into the respective female terminals of the connector housing 107. An insulating spacer 109 is provided between the electronic circuit board 104 and the insulating board 106 to avoid unnecessary electrical connection.

However, there have been the following problems concerning the connection structure of the bus-bar in the conventional electrical connection box.

(1) When a wiring pattern (not shown) is formed for a number of electronic parts provided on the electronic circuit board 104, it is needed to form the wiring pattern up to the edge portion where the female terminals 108 are provided. Moreover, as a space for use in fitting up the female terminals 108 becomes necessary and this results in a large-sized electronic circuit board 104, thus increasing the cost.

(2) The edge portion of the electronic circuit board 104 requires the female terminals 108 and the connector housing 107 so as to electrically connect the electronic parts 103 to the respective bus-bars 105, so that the number of parts tends to increase.

(3) Moreover, because the bus-bar tab 105a connected to the female terminal 108 is formed by processing the edge portion of the bus-bar 105, any intermediate part of the bus-bar 105 cannot be connected to the female terminal 108 and when one bus-bar is connected to two or more connecting parts, for example, it is needed to use the same number of bus-bars as the number of connecting parts. Consequently, the utilization efficiency of the space for used in arranging the bus-bars has been poor.

SUMMARY OF THE INVENTION

An object of the present invention is to solve the foregoing conventional technical problems and to provide a circuit forming method and a circuit connection structure that are capable of making smaller an electronic circuit board as well as reducing the number of parts.

There is provided a circuit forming method in an electrical connection box according to the invention with an electronic circuit board and an insulating board being stacked up and housed therein, comprising the steps of providing not only a through-hole in the electronic circuit board but also lead wires or electric wires of electronic parts in a manner straddling the through-hole, providing the bus-bars on the insulating board so that the upright pressure-contact knife-edges of the respective bus-bars may be arranged in a position corresponding to the through-hole of the insulating board, and stacking up the electronic circuit board and the insulating board by moving both the boards close to each other in such a condition that the pressure-contact knife-edges are passing through the through-hole, and pressure-welding the lead wires or electric wires to the respective pressure-contact knife-edges.

There is provided a circuit connection structure comprising: an electronic circuit board having a through-hole, the electronic circuit board being provided with lead wires or electric wires of electronic parts in a manner straddling the through-hole, and an insulating board provided with bus-bars having upright pressure-contact knife-edges electrically connected to the lead wires or electric wires, wherein the electronic circuit board and the insulating board are stacked up by relatively moving both the boards close to each other in such a condition that the pressure-contact knife-edges are passing through the through-hole; and the lead wires or electric wires are pressure-welded to the respective pressure-contact knife-edges.

As the lead wires are pressure-welded to the respective pressure-contact knife-edges passed through the through-hole provided in the electronic circuit board in this circuit forming method and the circuit connection structure, the space for use in fitting the female terminals to the edge portion of the board in the prior art can be dispensed with, which results in making it possible to reduce the size of the electronic circuit board. Moreover, the pressure-contact knife-edges are directly pressure-welded to the respective lead wires, so that female terminals and the connector housing necessitated in the prior art can be omitted, which results in reducing the number of parts.

In the circuit connection structure according to the invention, the pressure-contact knife-edges are formed separately from the respective bus-bars, and the pressure-contact knife-edges may be fitted to the respective bus-bars in such a condition that the former has been electrically connected to the latter.

With this arrangement, as any number of pressure-contact knife-edges can freely be provided to the end portion or mid position of the bus-bar, the utilization efficiency of the space for use in disposing the bus-bars becomes improvable thereby.

DETAILED DESCRIPTION OF THE PRESENT INVENTION

An embodiment of the present invention will now be described concretely.

Figure 1:
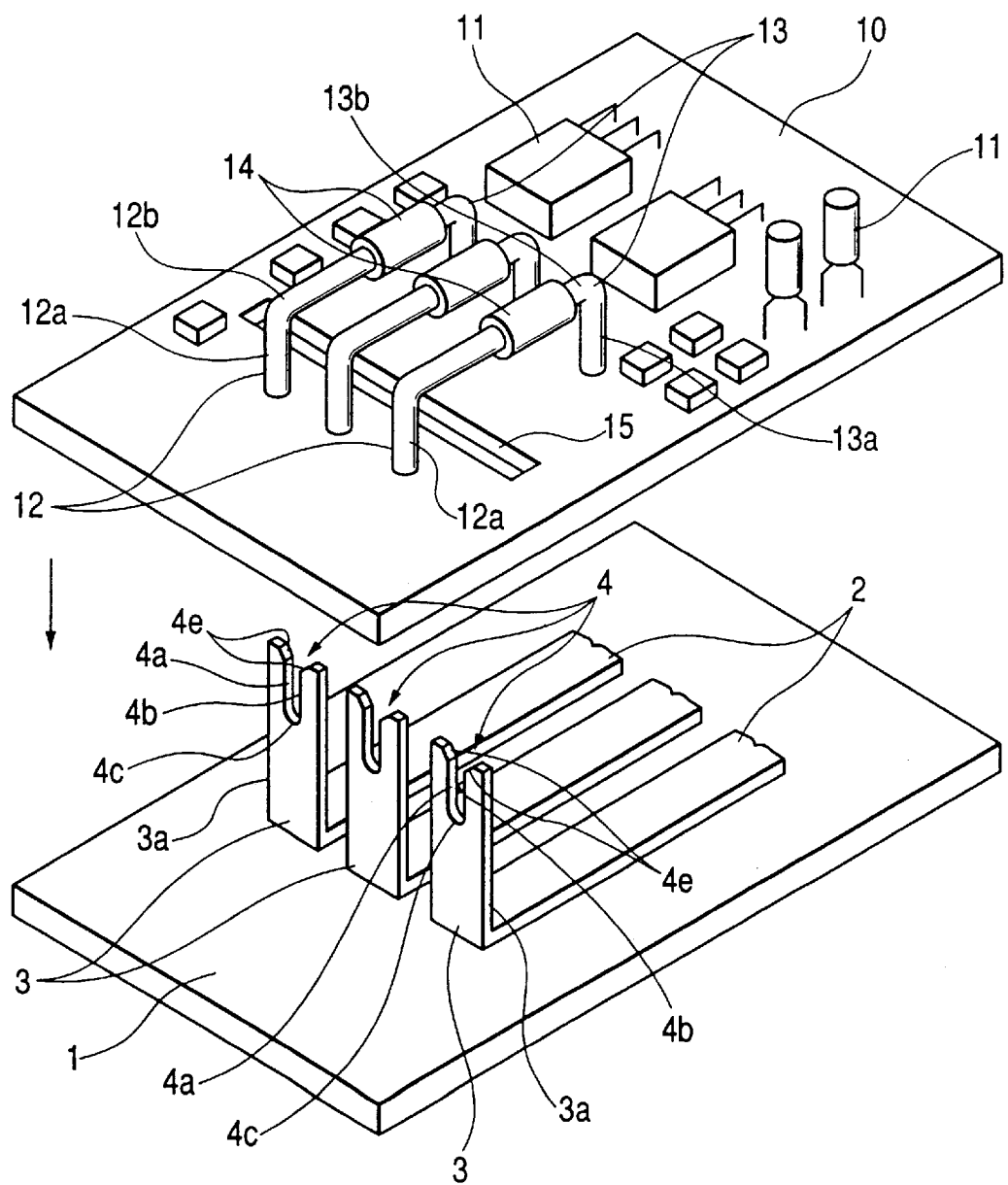
FIG. 1 is an exploded perspective view of a bus-bar connection structure in an electrical connection box embodying the invention.
Figure 2:
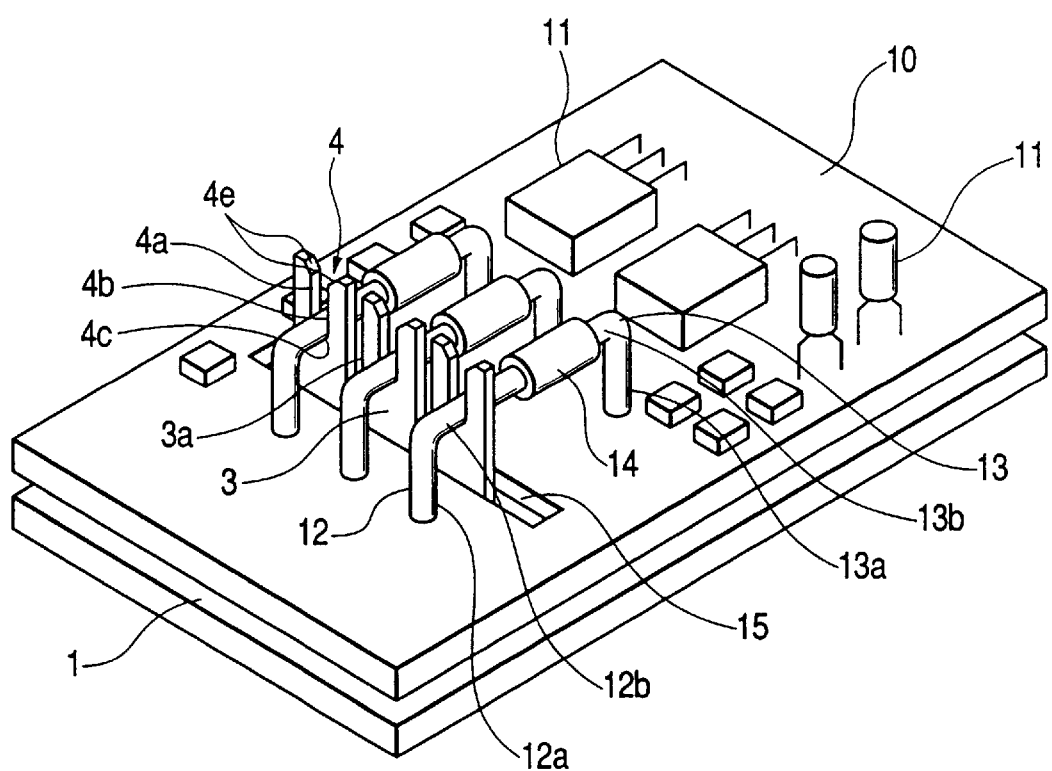
FIG. 2 is a perspective view of the bus-bar connection structure in the electrical connection box according to the embodiment of the invention.

FIG. 1 is an exploded perspective view of a circuit connection structure in an electrical connection box embodying the invention; and FIG. 2 is a perspective view of the circuit connection structure.

The circuit connection structure is retained in a space formed between a lower case portion and an upper case portion (these being not shown) constituting the electrical connection box, an insulating board 1 being provided on the lower side and an electronic circuit board 10 being provided on the upper side.

A plurality of bus-bars 2, three of them in the example of FIG. 1, are arranged side by side on the surface of and in the width direction of the insulating board 1, and the edge portion of each bus-bar 2 is made an upright pressure-contact knife-edge 3. The pressure-contact knife-edge 3 has a slot 4, and a knife edge is formed on both vertical edge faces 4a and 4b of the slot 4 and on an arcuate edge face 4c therebetween. Further, a chipped tilted guide portion 4e is formed in the upper edge portion of each of the edge faces 4a and 4b.

A wiring pattern (not shown) is formed on the undersurface of the electronic circuit board 10, and a number of electronic parts 11 electrically connected to the predetermined wiring pattern are mounted thereon. Part of the electronic parts are electronic parts 14, each of which has lead wires 12 and 13 on its respective both sides as external terminals and there are provided three of the electronic parts 14 in the example of FIG. 1. The electronic parts 14 include, for example, resistors, capacitors or diodes.

The lead wires 12 and 13 are made of electroconductive material such as copper and aluminum and as shown in FIG. 1 have vertical portions 12a and 13a and horizontal portions 12b and 13b, respectively. The horizontal portions 12b on one side are provided in a manner striding over a through-hole 15.

The electronic parts 14 are fitted to the electronic circuit board 10 by inserting the vertical portions 12a and 13a into holes provided in the electronic circuit board 10 and also electrically connected thereto by soldering the vertical portions 12a and 13a to the wiring pattern (not shown) formed on the undersurface of the electronic circuit board 10.

The through-hole 15 is used to insert the pressure-contact knife-edges 3 to the extent that they are passed therethrough.

The width of the through-hole 15 is slightly greater than the thickness of each pressure-contact knife-edge 3 and the length thereof is slight greater than the distance between the outer sides 3a and 3a of both the outer pressure-contact knife-edges 3 out of three of them.

Either insulating board 1 or electronic circuit board 10 may be made first.

The insulating board 1 and the electronic circuit board 10 are thus arranged inside the lower case portion (not shown) and then the spacer (not shown) is inserted. Subsequently, the electronic circuit board 10 is moved closer (lowered) to the insulating board 1 while the three pressure-contact knife-edges are passed through the through-hole 15. Even though the position of the lead wires 12 relative to that of the respective slots 4 at this time, each lead wire 12 is guided by the slanted guide portion 4e formed above the slot 4 to ensure that the lead wires 12 enter the slots 4. After this, the lead wires 12 of the electronic part 14 and the bus-bars 2 are clamped or pressure-welded.

Figure 3A:
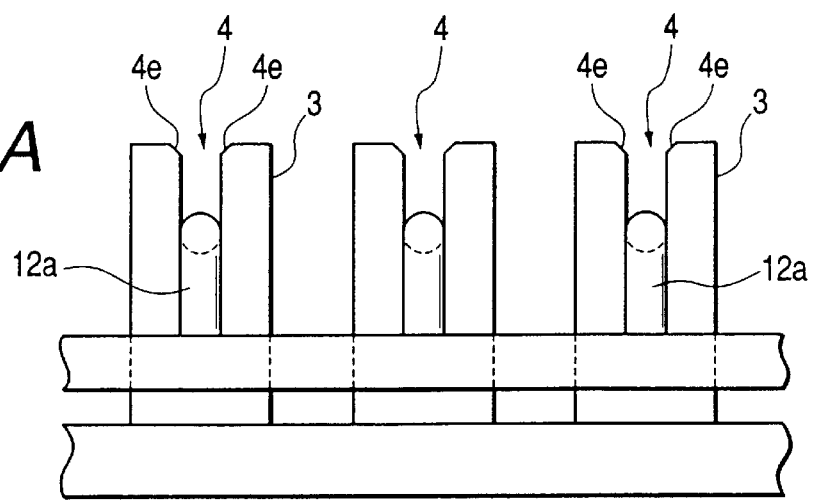
FIG. 3A is an elevational view of the vicinity of the pressure-welded portion of the bus-bar connection structure in the electrical connection box according to the embodiment of the invention.
Figure 3B:
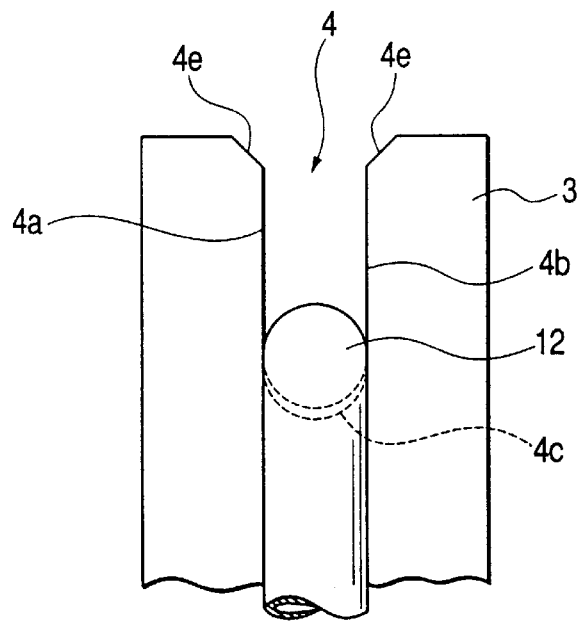
FIG. 3B is a partial enlarged view of the portion above.

By clamping or pressure-welding it is meant that as shown in FIG. 3A, the horizontal portion 12b of each lead wire 12 enters the inner side of the slot 4 and that as shown in FIG. 3B the slot 4 is brought into contact with the horizontal portion 12b of the lead wire 12 whereby to make the lead wire 12 of the electronic part 14 electrically contact the bus-bar 2. In this case, the space (not shown) made of insulating material is held between the insulating board 1 and the electronic circuit board 10 so as to prevent the electrical connection between the wiring pattern formed on the undersurface of the electronic circuit board 10 and the bus-bars 2 provided on the surface of the insulating board 1.

The circuit connection structure according to this embodiment of the invention is obtained by the circuit forming method thus implemented.

Further, the dimension of the estrangement between the edge faces of the slot 4 is set slight shorter than the diameter of the horizontal portion 12b of each lead wire 12, and the height of the horizontal portion 12b of the lead wire 12 from the electronic circuit board 10 is so arranged that what is lower than the tilted guide portions 4e of the respective edges faces 4a and 4b of the slot 4 is brought into contact with the horizontal portion 12b in such a state that the insulating board 1 has been placed on top of the electronic circuit board 10.

Therefore, as the lead wires 12 are pressure-welded to the respective pressure-contact knife-edges passed through the through-hole 15 provided in the electronic circuit board 10 according to this embodiment of the invention, the space for use in fitting the female terminals 108 to the edge portion of the board in the prior art can be dispensed with, which results in making it possible to reduce the size of the electronic circuit board 10. Moreover, the pressure-contact knife-edges 3 are directly pressure-welded to the respective lead wires 12, so that female terminals 108 and the connector housing 107 necessitated in the prior art can be omitted, which results in reducing the number of parts. In addition, because the provision of straight bus-bars 2 on the insulating board 1 is only suffice for the purpose, the bus-bars 2 can be arranged for common use.

Figure 4:
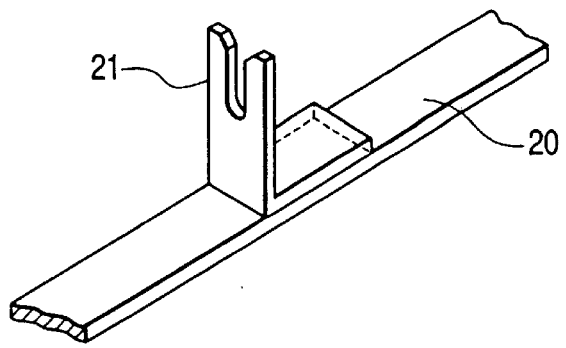
FIG. 4 is a perspective view explanatory of another form of pressure-contact knife-edge usable according to the invention.
Figure 5:
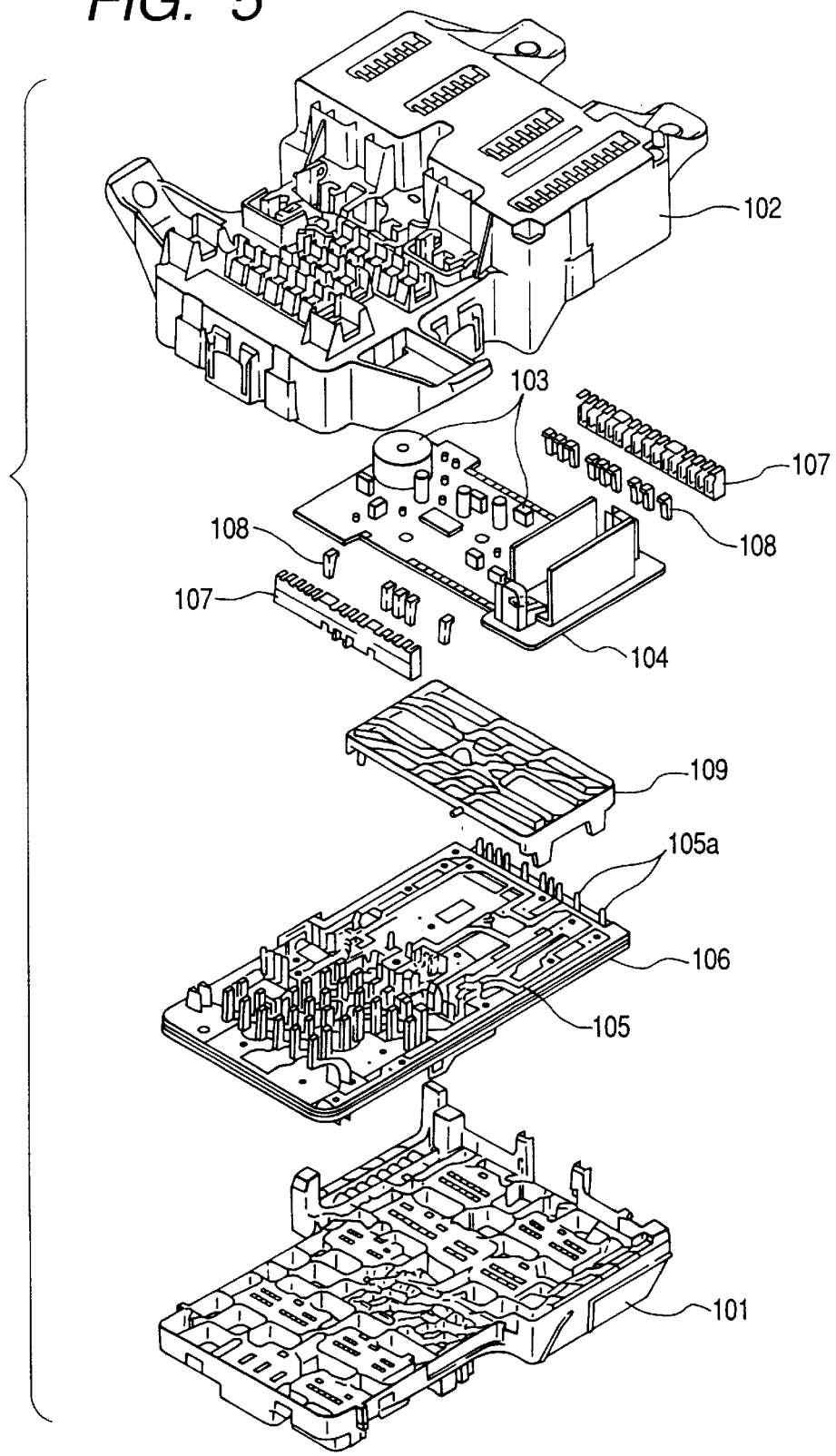
FIG. 5 is a perspective view of a bus-bar connection structure in a conventional electrical connection box.

Although the pressure-contact knife-edge 3 as the bus-bar tab is formed in the end portion of each bus-bar 2 itself as shown in FIG. 1 according to the above embodiment of the invention, the invention is not limited to this arrangement but may be arranged as shown in FIG. 4 so as to form a bus-bar 20 and a pressure-contact knife-edge 21 separately and to have the pressure-contact knife-edge 21 fitted to the bus-bar 20 by pressure-welding. With this arrangement, the pressure-contact knife-edge 21 may be fitted to the desired position of the bus-bar 20, for example, the mid position or end portion of the bus-bar 20 as shown in FIG. 4 and any number of pressure-contact knife-edges may be fitted thereto. The advantage in this case is that the utilization efficiency of the space for use in disposing the bus-bars becomes improvable thereby.

An example of pressure-welding the three lead wires to the respective three bus-bars according to the above embodiment of the invention has been described, the invention is not limited to this arrangement but may be applicable to a case where one or more than one lead wire are pressure-welded to the corresponding number of bus-bars.

Further, though a description has been given of the case of electrically connecting the bare lead wires and the bus-bars disposed for external connection to the electronic parts such as the resistor respectively by way of example, the invention is not limited to this arrangement but may be equally applicable to a case where conductors of lead wires as electronic parts are externally covered wires, or bare or covered electric wires provided to electronic parts for external connection. In this case, the bare and the covered lead wires are intended for use in supporting the electronic parts in addition to the electrical connection. When the comparatively hard lead wires and the bus-bars are electrically connected together, it is not necessary to bother about the hardness of the lead wire so much. On the other hand, the bare and covered lead wires are such that they are not strong enough to support the electronic parts but comparatively soft and usable in place of the wiring pattern, for example. When comparatively soft electric wires are applied to the pressure-contact technology according to the invention, they should preferably have desired hardness, whereby they are prevented from escaping when pressed down by the pressure-contact knife-edges.

When the covered lead wires and covered electric wires are employed according to the invention, the insulating condition can be secured relative to any other wiring pattern or electronic part and this is advantageous in that a short circuit is preventable.

As set forth above, since the lead wires are pressure-welded to the respective pressure-contact knife-edges passed through the through-hole provided in the electronic circuit board in this circuit forming method and the circuit connection structure, the space for use in fitting the female terminals to the edge portion of the board in the prior art can be dispensed with, which results in making it possible to reduce the size of the electronic circuit board. Moreover, the pressure-contact knife-edges are directly pressure-welded to the respective lead wires, so that female terminals and the connector housing necessitated in the prior art can be omitted, which results in reducing the number of parts.

In the circuit connection structure according to the invention, the pressure-contact knife-edges are formed separately from the respective bus-bars and when the pressure-contact knife-edges are be fitted to the respective bus-bars in such a condition that the former has been electrically connected to the latter, any number of pressure-contact knife-edges can freely be provided to the end portion or mid position of the bus-bar, whereby the utilization efficiency of the space for use in disposing the bus-bars becomes improvable.

What is claimed is:

1. A method of forming a circuit in an electrical connection box having an electronic circuit board and an insulating board being stacked and housed in the connection box, the method comprising:

providing a through-hole in the electronic circuit board;

providing a lead wire of an electronic component in a manner straddling the through-hole;

providing at least one bus bar on the insulating board with an upright pressure-contact knife-edge arranged in a position corresponding to the through-hole of the insulating board;

moving the electronic circuit board and the insulating board toward each other in such a condition that the pressure-contact knife-edge passes through the through-hole without having a housing around the pressure contact knife-edge;

stacking the electronic circuit board and the insulating board; and clamping the wire to the pressure-contact knife-edge by inserting the lead wire into a slot on the pressure-contact knife-edge.

2. A circuit connection structure comprising:

an electronic circuit board having a through-hole, the electronic circuit board having at least one lead wire of an electronic component straddling the through-hole, an insulating board having at least one bus-bar having an upright pressure-contact knife-edge electronically connected to the lead wire, and wherein the electronic circuit board and the insulating board are stacked by moving both the boards close to each other in such a condition that only the pressure-contact knife-edge passes through the through-hole without intervening structure between surfaces of the pressure-contact knife-edge and a perimeter of the through hole; and the at least one lead wire is clamped to the pressure-contact knife-edge.

3. The circuit connection structure as claimed in claim 2, wherein the pressure-contact knife-edge is formed separately from the bus-bar; and the pressure-contact knife-edge is fitted to the bus-bar in such a condition that the pressure-contact knife-edge is electrically connected to the bus-bar.

4. An electrical connection box comprising:

a circuit board having an electrical component and a lead wire connected to the electrical component, the circuit board defining a hole above which the lead wire passes; and an insulating board stacked on the circuit board, the insulating board having a bus bar, wherein only a branch portion of the bus-bar passes through the hole and engages with the lead wire of the circuit board without intervening structure between the hole and the branch portion.

* * * * *